(12) United States Patent
Swanson et al.

(10) Patent No.: US 6,724,066 B2
(45) Date of Patent: Apr. 20, 2004

(54) HIGH BREAKDOWN VOLTAGE TRANSISTOR AND METHOD

(75) Inventors: Leland Swanson, McKinney, TX (US); Gregory E. Howard, Dallas, TX (US)

(73) Assignee: Texas Instruments Incorporated, Dallas, TX (US)

(*) Notice: Subject to any disclaimer, the term of this patent is extended or adjusted under 35 U.S.C. 154(b) by 45 days.

(21) Appl. No.: 10/041,017

(22) Filed: Jan. 7, 2002

(65) Prior Publication Data

US 2002/0158309 A1 Oct. 31, 2002

Related U.S. Application Data

(60) Provisional application No. 60/287,462, filed on Apr. 30, 2001.

(51) Int. Cl.[7] ............................................. H01L 27/082
(52) U.S. Cl. ........................ 257/557; 257/526; 257/565
(58) Field of Search ................................. 257/526, 557, 257/565

(56) References Cited

U.S. PATENT DOCUMENTS

| | | | |
|---|---|---|---|
| 5,583,059 A | | 12/1996 | Burghartz |
| 6,100,152 A | * | 8/2000 | Emons et al. ............... 438/350 |
| 6,297,118 B1 | * | 10/2001 | Patti .......................... 438/309 |
| 6,310,368 B1 | * | 10/2001 | Yagura ....................... 257/197 |
| 6,465,870 B2 | * | 10/2002 | Voldman .................... 257/565 |
| 6,506,656 B2 | * | 1/2003 | Freeman et al. ........... 438/309 |
| 6,521,974 B1 | * | 2/2003 | Oda et al. .................. 257/593 |

OTHER PUBLICATIONS

A. Q. Huang et al., "Novel High Voltage SOI Structures," *IEEE BCTM 5.3*, 1999, pp. 84–88.
Wen–Ling Margaret Huang et al., "TFSOI Complementary BiCMOS Technology for Low Power Applications," *IEEE Transactionson Electron Devices*, vol. 42, No. 3, Mar. 1995, pp. 506–512.
R. Dekker et al., "An Ultra Low Power Lateral Bipolar Polysilicon Emitter Technology on SOI," *IEDM 93*, pp. 75–78.
R. Dekker et al., "An Ultra Low–Power RF Bipolar Technology on Glass," *IEDM 97*, pp. 921–923.
G. G. Shahidi et al., "A Novel High–Performance Lateral Bipolar on SOI," *IEDM 91*, pp. 663–666.
Hideaki Nii et al., A Novel Lateral Bipolar Transistor with 67 GHz fmax on Thin–Film SOI for RF Analog Applications, *IEEE Transactions on Electron Devices*, Vol 47, No. 7 Jul. 2000.
Alex Y. Tang et al., "A Dual Burried Layer Technology for the Fabrication of High Voltage NPN Devices Compatible with a 1.5 Micron Epitaxial Bipolar Process," *IEEE 31st Int. Electron Devices Meeting*, 1985, pp. 298–301.

* cited by examiner

Primary Examiner—Richard Elms
Assistant Examiner—Christian D. Wilson
(74) Attorney, Agent, or Firm—Michael K. Skrehot; W. James Brady, III; Frederick J. Telecky, Jr.

(57) ABSTRACT

An integrated circuit that includes a high breakdown voltage bipolar transistor. The bipolar transistor includes an emitter 36, a base 32, and a collector structure. The emitter 36 is adjacent to and overlies the base 32 and the base 32 is adjacent to and overlies a core portion 48 of the collector structure. The collector structure includes, in addition to the core portion 48, a collector contact region 31 and a lateral collector region 50 between the core portion 48 and the collector contact region 31. The lateral collector region 50 is thinner than said collector contact region at some point along its length.

17 Claims, 6 Drawing Sheets

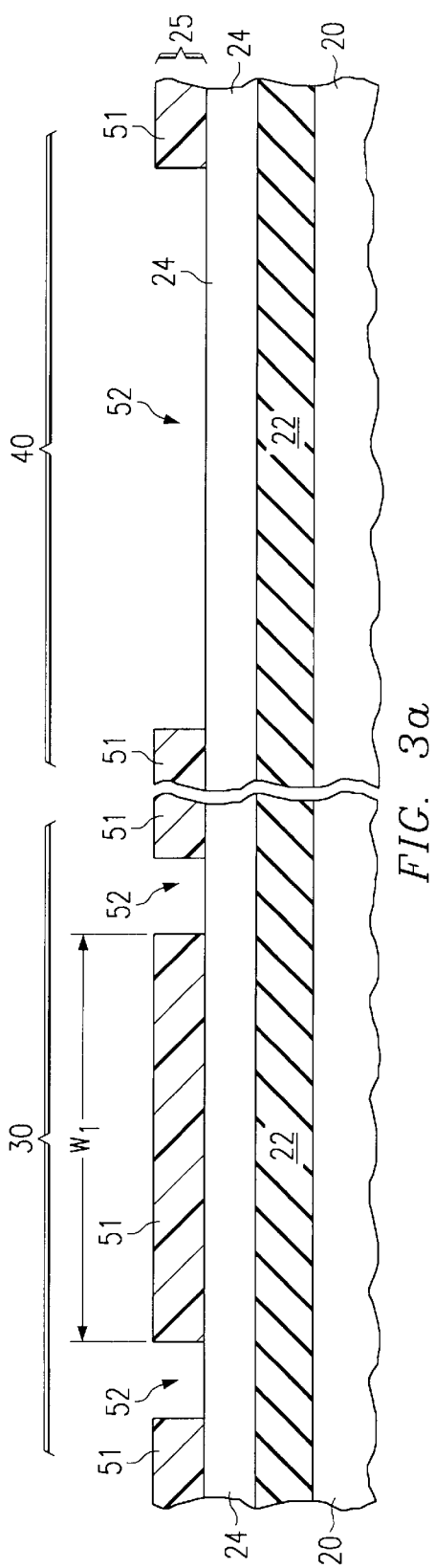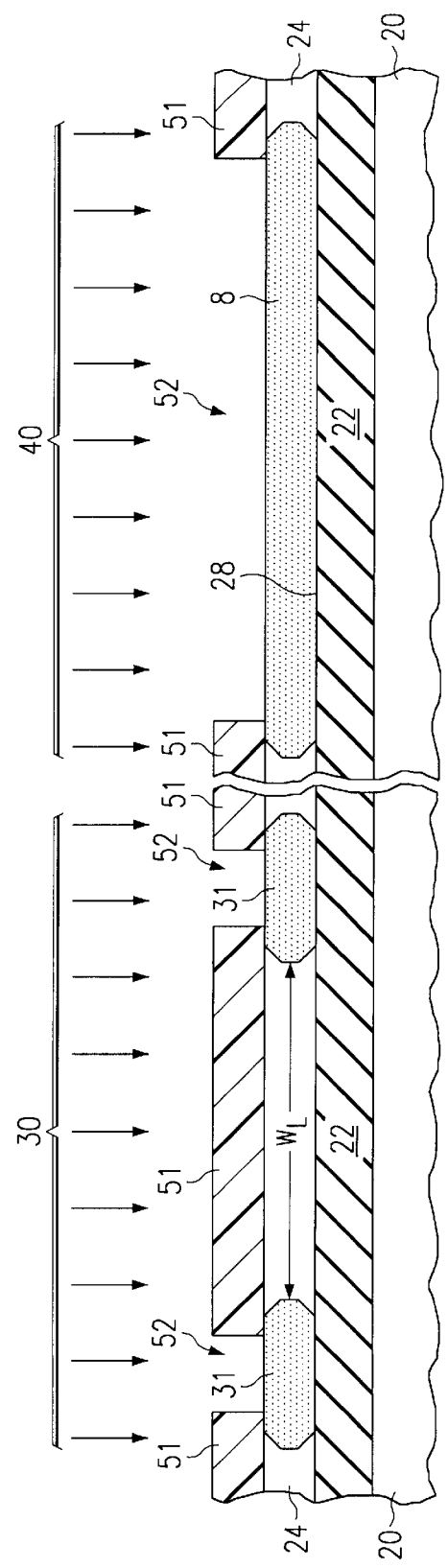

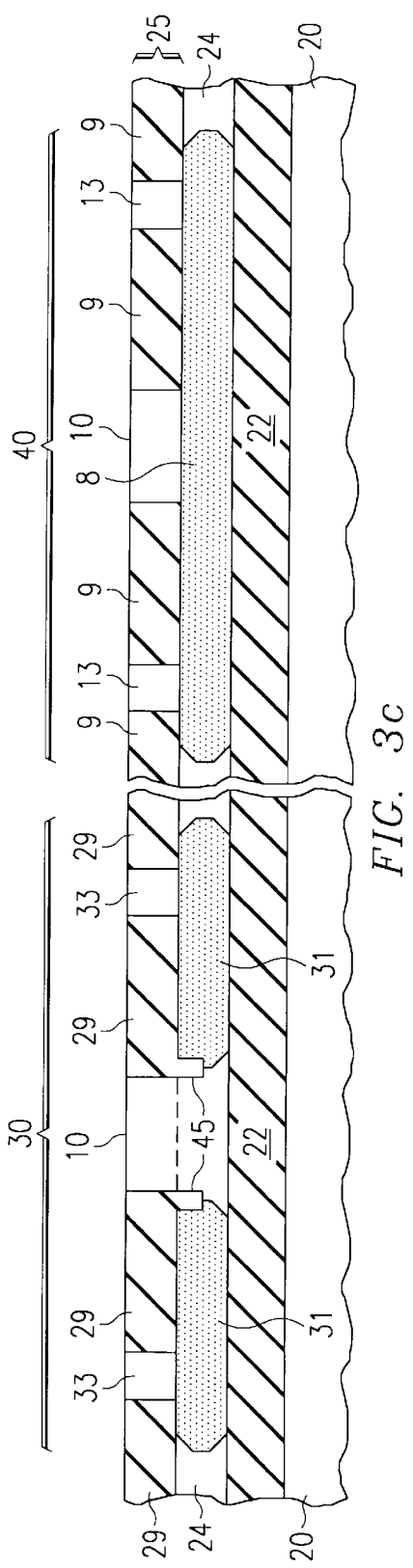
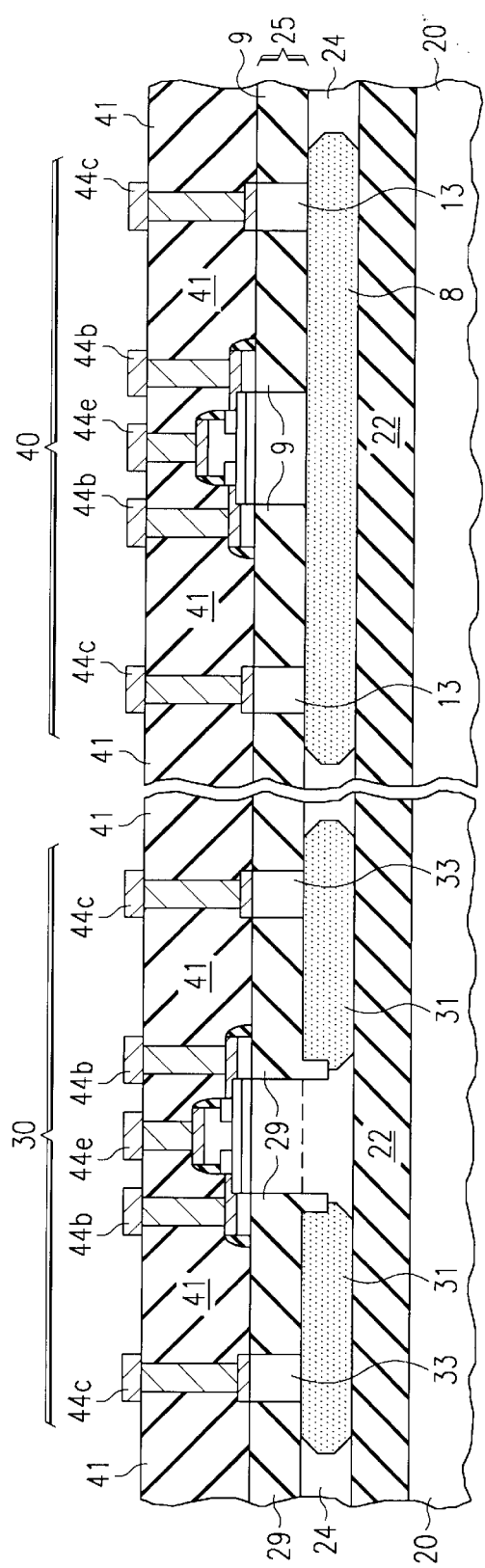
FIG. 3c
FIG. 3d

HIGH BREAKDOWN VOLTAGE TRANSISTOR AND METHOD

CROSS-REFERENCE TO RELATED APPLICATIONS

This application claims priority from provisional application 60/287,462, filed Apr. 30, 2001.

BACKGROUND OF THE INVENTION

This invention is in the field of bipolar transistors, and is more specifically directed to bipolar transistors with high breakdown voltage characteristics.

The bipolar transistor is one of the most important semiconductor devices, with applications in computers, vehicles, satellites, and in communication and power systems. FIG. 1 is a conventional high-performance p-n-p bipolar transistor 2 formed as a silicon-on-insulator ("SOI") device. An n-p-n device would be formed substantially identically as shown in FIG. 1, but with opposite doping conductivity types. Indeed, in many applications, complementary bipolar circuits are formed in the same SOI integrated circuit, having both n-p-n and p-n-p devices formed in this manner.

In this example, substrate 4 effectively serves as a support for the structure. Buried oxide layer 6 and overlying epitaxial layer 8 are formed at a surface of substrate 4 by the conventional techniques of oxygen implantation, wafer bonding, or smart cut techniques. Epitaxial layer 8 is relatively heavily doped p-type in this example, and serves as a buried collector region. In this example, deep trench isolation structure 7 separates individual structures in epitaxial layer 8, thus isolating buried collectors from one another in the integrated circuit. Another epitaxial layer, including portions 10, 12 in this example, is then disposed above and in contact with buried layer 8 in selected locations, separated by shallow trench isolation structures 9. As shown in FIG. 1, shallow trench isolation structures 9 are contiguous with deep trench isolation structures 7 in certain locations to isolate individual devices from one another.

Epitaxial layer 10 is doped in various locations in the definition of transistor 2. In this example, one epitaxial layer portion is heavily doped n-type to serve as collector sinker contact 12; a still heavier doped region 13 is provided at the surface of sinker 12, to further improve the ohmic contact to the collector of transistor 2. Another portion of epitaxial layer 10 is more lightly-doped, either in-situ with its epitaxial formation or by subsequent ion implantation, to form collector region 11.

Overlying collector region 11 is base region 14. In this example, base region 14 may be an n-type doped silicon layer, or an n-type silicon-germanium layer, epitaxially deposited or otherwise formed at the surface of collector region 11. As is known in the art, the use of a silicon-germanium base provides a high performance heterojunction device, while a silicon base provides a lower performance device at lower manufacturing cost. Polysilicon base structures 15 are disposed adjacent epitaxial base region 14 to provide a location at which electrical contact to the base may be made. Intrinsically-doped silicon buffer layer 19 is disposed over polysilicon base structures 15 and base region 14. Transistor 2 is completed by the formation of emitter 16, which may be a heavily doped p-type element formed of polysilicon, and from which emitter region 17 diffuses into buffer layer 19. As a result of this construction, in the operation of transistor 2, collector-emitter current is conducted substantially by collector region 11 within layer 10. Each of collector contact 13, polysilicon base structures 15, and emitter electrode 16 in transistor 2 according to this embodiment of the invention are made further conductive by the formation of self-aligned silicide layers 18c, 18b, and 18e, respectively.

The breakdown characteristics of transistor 2 are limited by its construction. In a typical bipolar transistor, the collector-emitter breakdown voltage (BVCEO) and the collector transit time depend upon the thickness and doping concentration of collector region 11. Lighter doping and a thicker collector region 11 would increase the breakdown voltage and collector transit time. Ideally, transistors having both high voltage and high speed performance (low transit time) are desired. The optimization of bipolar transistor 2 relative to these two countervailing effects necessarily results in a tradeoff of breakdown voltage versus peak transition frequency. It is typical for an integrated circuit to include specific transistors that are optimized for high voltage operation, and also specific transistors that are optimized for performance, rather than attempting to arrive at a single device structure that is optimized for both.

BRIEF SUMMARY OF THE INVENTION

In one embodiment of the invention, an integrated circuit that includes a bipolar transistor is disclosed. The bipolar transistor includes an emitter; a base; and a collector structure. The emitter is adjacent to and overlies the base and the base is adjacent to and overlies a core portion of the collector structure. The collector structure includes, in addition to the core portion, a collector contact region and a lateral collector region between the core portion and the collector contact region. The lateral collector region is thinner than the collector contact region at some point along its length.

In another embodiment of the invention, another integrated circuit that includes a bipolar transistor is disclosed. The bipolar transistor in this embodiment includes a collector structure overlying a buried insulator layer. The collector structure includes a first layer adjacent to the buried insulator layer that includes a central lightly doped region and a peripheral heavily doped region. The collector structure also includes a second layer overlying the central lightly doped region of the first layer and is further characterized by a trench in the central lightly doped region at a point between the peripheral heavily doped region and a point where the second layer overlies said first layer. The transistor also includes a base structure adjacent to and overlying the second layer in the collector structure and an emitter structure adjacent to and overlying the base structure.

In still another embodiment of the invention, a method of forming an integrated circuit that includes a bipolar transistor is disclosed. The method includes steps of forming a collector structure comprising a core and a lateral portion; removing an upper section of the lateral portion to leave a pedestal comprising the core portion of the collector structure surrounded by a lower section of the lateral portion; and forming a trench in the lower section of the lateral portion. The method also includes the step of forming a collector contact region in the lower section of the lateral portion such that the trench lies between the pedestal and the collector contact region, as well as the steps of forming a base structure over the collector structure; and forming an emitter structure over the base structure.

An advantage of the embodiment transistors is that they possess high breakdown voltage characteristics and can be formed in substantially the same process used to produce relatively high performance transistors.

BRIEF DESCRIPTION OF THE SEVERAL VIEWS OF THE DRAWINGS

FIGS. 3a through 3d are cross-sectional views illustrating the construction of the high-voltage bipolar transistor of FIG. 2, in combination with a corresponding transistor designed for high performance, according to a first preferred embodiment of the invention.

FIG. 4a also shows the collector dopant profile superimposed upon the transistor cross-section.

DETAILED DESCRIPTION OF THE INVENTION

The present invention will now be described in connection with its preferred embodiments. These exemplary embodiments are directed to the fabrication of bipolar junction transistors in a silicon-on-insulator (SOI) structure, but it is contemplated that the present invention will be equally applicable to conventional, non-SOI structures. It will be appreciated by those skilled in the art having reference to this specification that the present invention may be used to form either p-n-p or n-p-n transistors, used in a complementary bipolar or BiCMOS technology, as well as used in other alternative structures and methods of fabricating such structures in integrated circuits. Furthermore, while these embodiments are silicon or SiGe n-p-n and p-n-p bipolar transistors, it is contemplated that the present invention will be equally applicable to emerging bipolar technologies such as silicon-germanium-carbon (SiGeC) and SiC bipolar technologies. It is therefore to be understood that these and other alternatives to the embodiments described below are contemplated to be within the scope of the invention as claimed.

Figure 2:
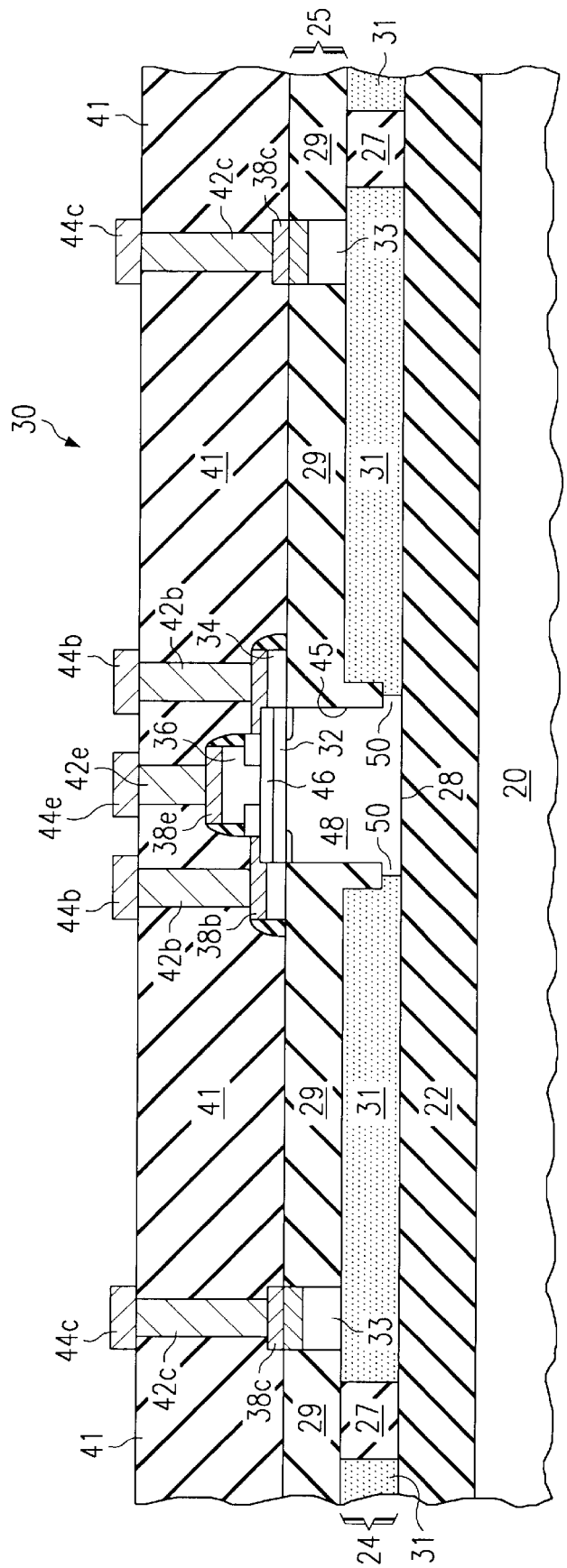
FIG. 2 is a cross-sectional diagram of a high voltage bipolar transistor according to a first preferred embodiment of the invention.

Referring first to FIG. 2, the construction of p-n-p high-voltage transistor 30 according to a first preferred embodiment of the invention will now be described in detail. The cross-section of transistor 30 in FIG. 2 illustrates buried insulator layer 22 in place over substrate 20 in the typical manner for SOI structures. Buried insulator layer 22 is typically silicon dioxide, and as such is generally referred to as buried oxide. Transistor 30 is formed in and above buried oxide 22 and has a collector structure including a core portion 48 formed in silicon layers 24 and 25, and a lateral region 50 formed in layer 24. Collector core portion 48 is thicker than lateral collector region 50, such that the core 48 forms a pedestal surrounded by lateral portion 50.

Layer 24 is a layer of single-crystal silicon. Transistor 30 is isolated from neighboring devices by way of deep trench isolation structures 27, formed of deposited silicon dioxide. According to this embodiment of the invention, the portion of layer 24 associated with transistor 30 includes central collector region 28 (comprising regions 48 and 50) and peripheral buried collector portions 31. Collector region 28 in this embodiment of the invention is a relatively lightly doped p-type region, for example having a thickness on the order of 1.0 $\mu$m and a doping concentration of on the order of $1.0 \times 10^{15}$ cm$^{-3}$. Buried collector portions 31, on the other hand, are relatively heavily doped, with a p-type doping concentration of on the order of $1.0 \times 10^{19}$ cm$^{-3}$ for example. The function of buried collector portions 31 is to provide a highly conductive collector contact or connection from collector terminals 44c to collector region 28. Collector region 28, on the other hand, serves as part of the active collector of transistor 30.

Shallow trench isolation structures 29, for example formed of deposited silicon dioxide, are disposed within selected portions of a second epitaxial layer 25 above the depth of buried collector portions 31. A medium deep trench 45 extends into the first epitaxial layer 24 within the collector region 28, thus making the lateral portion of the collector 28 non-uniform in thickness between the core portion 48 and the collector contact region 31 of layer 24. Shallow trench isolation structures 29 overlie medium trenches 45 and also overlie deep trench isolation structures 27 to complete the electrical isolation of transistor 30 from neighboring devices. Medium trench 45 is deeper than the shallow trench isolation structures 29, but not as deep as the deep trench isolation structures 27, which extend to the buried oxide 22. Shallow trench isolation structures 29 are arranged to define the locations of collector sinker structure 33, as well as a portion of collector region 28 that extends to the base and emitter of transistor 30, as described below. Collector sinker structures 33 are heavily doped p-type silicon regions of epitaxial layer 25, and may have a p+ doped region at the surface thereof to further improve ohmic contact. Silicide-clad collector contact terminals 38c are disposed at the surface of sinker structures 33 in this embodiment of the invention, further improving conductivity.

There is a compromise between the high voltage characteristic of a transistor and its high speed performance. The lower the voltage is, the higher the performance. With reference to the first embodiment of the invention described hereinabove, the preferred location of the medium trench 45 and buried collector portion 31 is one where the medium trench is aligned with the edge of shallow trench 29 that is adjacent to the core portion of the collector 48. The medium trench is preferably about 0.5 $\mu$m wide. Also, the buried collector portion 31 is preferably coincident with either the edge of the medium trench 45 that is opposite the core portion of the collector 48 or about one half way along the bottom edge of the medium trench. The configuration described above results in a particularly advantageous electric field profile of the collector depletion region, which in turn produces very short collector transit times. The breakdown voltage for this configuration is set by the thickness of layer 24. Generally, the high performance transistor BVceo is set by the thickness of layer 25, since the dopants in buried layer 31 are designed to diffuse up to the bottom of the shallow trench 29. Hence, by positioning the medium trench 45, and buried layers 31, the BVceo of both the high performance and high voltage transistors can be approximately independently adjusted by setting the thickness of layers 25 and 24, respectively.

In the active region of transistor 30, epitaxial base region 32 is an n-type doped silicon or n-type silicon-germanium epitaxial layer disposed at the surface of collector region 48. Polysilicon base structures 34 are heavily doped n-type silicon regions surrounding epitaxial base region 32 and are contiguous with shallow trenches 29. Polysilicon base structures 34 have silicide-clad ohmic base contact terminals 38b at portions of their surface. Intrinsically doped silicon buffer layer 46 is disposed over polysilicon base structures 34 and epitaxial base region 32. Emitter 36 is disposed at the surface of epitaxial base region 32 between polysilicon base structures 34. Emitter 36 is a heavily doped p-type polysilicon structure, which serves as a source of p-type dopant that diffuses into buffer layer 46 to form the emitter of the device. The surface of emitter 36 has a silicide-clad emitter contact terminal 38e.

Transistor 30 in this embodiment of the invention provides external collector, base, and emitter connections by way of contact plugs 42c, 42b, 42e, respectively, each of which extend through overlying insulator layer 41 to corresponding metal conductors 44c, 44b, 44e, respectively. Connections are routed between collector, base, and emitter by conductors 44c, 44b, 44e, respectively, to and from other devices in the same integrated circuit that contains transistor 30.

FIG. 3a illustrates an early stage in the fabrication of an integrated circuit including a high voltage transistor 30 described above, in combination with bipolar transistor 40 which is designed for higher speed at a lower BVceo performance rather than high breakdown characteristics. Transistor 40 is shown for purposes of comparison and to illustrate that transistors 30 and 40 may be fabricated using substantially the same process on the same substrate. In this example, each of transistors 30 and 40 are p-n-p devices. It is to be understood that n-p-n transistors may be similarly formed by selecting the dopant species accordingly. At this stage of the process, substrate 20 is provided as support for the eventual structure. Typically, silicon substrate 20 has a relatively high resistance. Buried oxide layer 22 and overlying epitaxial layer 24 are then formed, for example by the conventional techniques of SIMOX or wafer bonding. In this preferred embodiment of the present invention in which transistors 30 and 40 are p-n-p devices, epitaxial layer 24 is a lightly doped p-type layer, formed to an initial thickness of on the order of 1.25 $\mu$m.

Following the formation of epitaxial layer 24, oxide mask layer 51 is formed by thermal oxidation of epitaxial layer 24 to a thickness sufficient to block ion implantation. In this example, oxide mask layer 51 is formed of thermal silicon dioxide to a thickness of on the order of 1.0 $\mu$m. This thermal oxidation consumes epitaxial layer 24 accordingly, for example down to a thickness of approximately 0.8 $\mu$m. Of course, oxide mask layer 51 may alternatively be deposited, if desired.

According to the first preferred embodiment of the invention, the locations of buried doped layers 31 are defined by patterning and removing selected locations 52 of oxide mask layer 51 and/or a thick photoresist. This patterning is preferably performed by way of conventional photolithography and etching, in which photoresist is dispensed, exposed through a photomask, and removed to expose selected locations of oxide mask layer 51. A conventional plasma or wet etch is then performed to remove the exposed locations of oxide mask layer 51. Following the removal of the remaining photoresist, the resulting structure appears in the form illustrated in FIG. 3a. The opposite polarity buried layer location that is implanted or diffused after the first is defined by thick photoresist.

As shown in FIG. 3a, opening locations 52 correspond to the eventual location of peripheral, relatively heavily-doped buried layer regions. The difference in construction between high voltage transistor 30 and high-speed transistor 40 is substantially defined by the width and location of these opening locations 52. In the region where high voltage transistor 30 is to be formed, opening locations 52 are relatively small, and are separated from the center of the transistor region. Oxide mask layer 51 includes a portion having a layout width $W_1$; as will be described below, the base and emitter of transistor 30 will be formed over the portion of epitaxial layer 24 underlying the portion of oxide mask layer 51 of width $W_1$.

In contrast, opening location 52 for transistor 40 is a relatively large region, including most of the area of transistor 40. As described above relative to FIG. 1, and as will become apparent from the following description, the collector region underlying the eventual emitter of transistor 40 is heavily doped. Both transistors 30 and 40 incorporate these heavily doped regions to minimize the device collector resistance.

Following the definition of oxide mask layer 51 and its openings at opening locations 52, the structure is subjected to ion implantation to dope the portions of epitaxial layer 24 at the locations exposed by opening locations 52, as shown in FIG. 3b. In this example, where transistors 30 and 40 are p-n-p devices, this implantation operation implants p-type dopant at these locations, at a relatively heavy dose such as $1.0 \times 10^{16}$ cm$^{-2}$ at 30 keV. Following a corresponding anneal, buried p+ regions 31 and 8 are formed in epitaxial layer 24 at the locations of transistors 30 and 40, respectively. In the area of transistor 30, a central collector region 28 is masked from this implantation by oxide mask layer 51. The width of collector region 28 is shown as distance $W_L$ as shown in FIG. 3b (and in FIG. 2a discussed above). Distance $W_L$ is somewhat reduced from layout width $W_1$ of oxide mask layer 51, due to lateral diffusion of the implanted dopant in the subsequent anneal.

Figure 1:
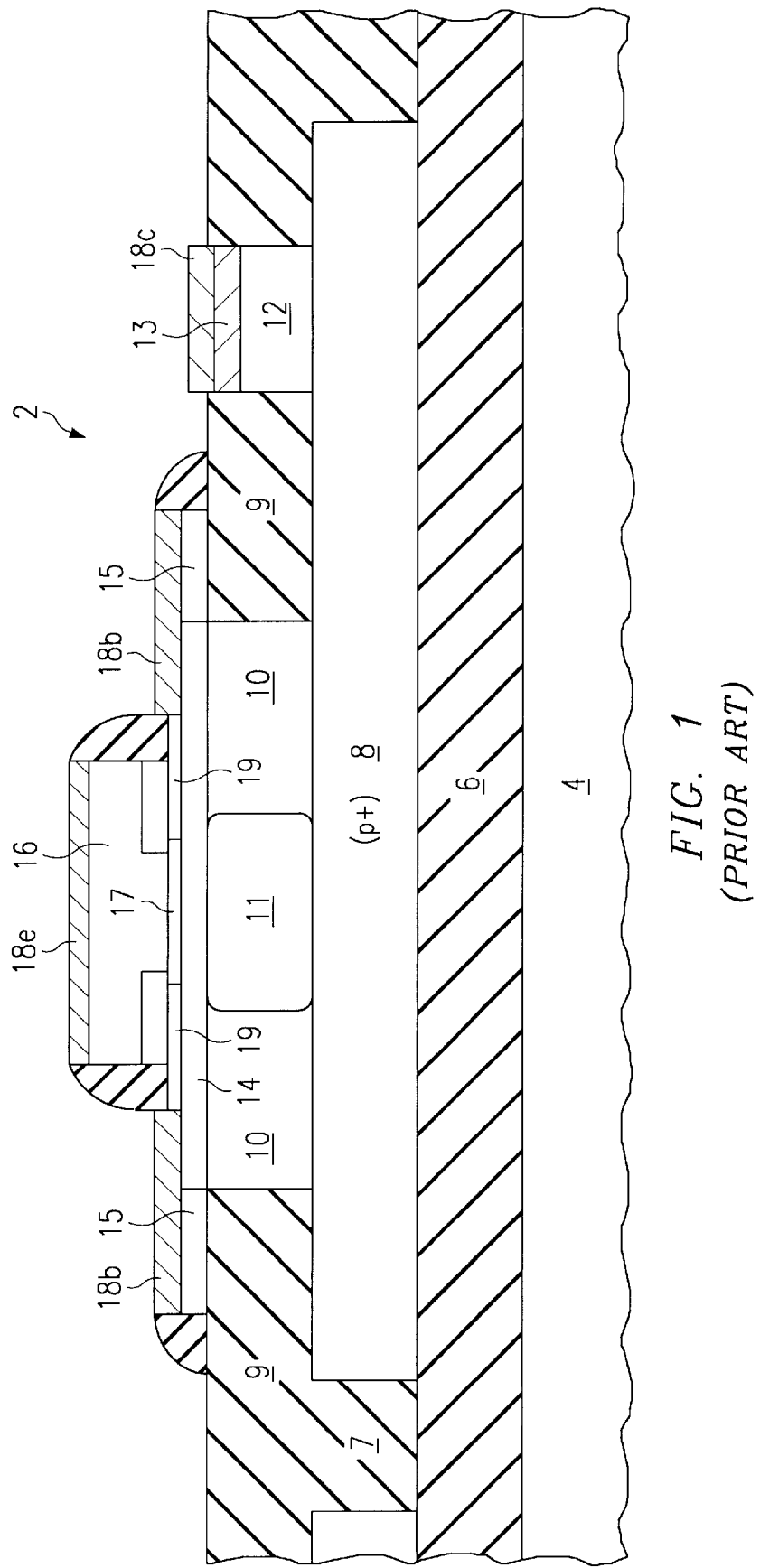
FIG. 1 is a cross-sectional diagram of a conventional high-performance bipolar transistor.

Referring now to FIG. 3c, the construction of transistors 30 and 40 continues with the removal of oxide mask layer 51 overall, followed by epitaxial growth of silicon from the surface of epitaxial layer 24, to form second epitaxial layer 25. Selected portions of this epitaxial layer 25 and of underlying epitaxial layer 24 are then removed by photolithographically patterning a mask layer and then performing a wet or plasma silicon etch to the desired depth, to define in two separate steps the locations of shallow trench isolation structures 9 and 29, and medium trenches 45. Another patterning and etch step into epitaxial layer 24 is also performed at this time to form the locations for deep trench isolation structures 7 and 27 as shown in FIGS. 1 and 2, respectively. The medium trench is aligned with the edge of the shallow trench 29 that is adjacent to the core portion of the collector 48. The medium trench is preferably about 0.5 $\mu$m wide. Also, the buried collector portion 31 is preferably coincident with either the edge of the medium trench 45 that is opposite the core portion of the collector 48 or about one-half way along the bottom edge of the medium trench. Both the deep and shallow isolation structures, as well as the medium trenches, are preferably formed by depositing silicon oxide into the openings and then planarizing the structure, producing shallow trench isolation structures 9 and 29 coplanar with second epitaxial layer 25, along with medium trenches 45 as shown in FIG. 3c. Deep trench isolation structures 7 and 27 are not shown in FIG. 3c for the sake of clarity.

In the region of transistor 30, the remaining vertical portion of epitaxial layer 25 effectively merges into collector region 28; in the region of transistor 40, this remaining vertical portion of epitaxial layer 25 becomes collector region 10. Collector region 28 and collector region 10 form the core of the collector structures for transistors 30 and 40. If desired, adjustment of the collector doping levels in both transistors 30 and 40 may be made by way of in-situ doping during epitaxy in the formation of epitaxial layers 24 and 25. Alternatively, enhanced performance of each transistor can be achieved by independent adjustment of collector doping levels by way of ion implantation of epitaxial layers 24 and 25 after formation thereof. If transistors 30 and 40 are being formed in combination with MOS transistors, for example in a BiCMOS process, either or both of these additional implants may correspond to well implants for the corresponding MOS devices, and thus come at no additional cost.

In addition, other portions of epitaxial layer 25 also remain as a result of the patterning and silicon etch to form collector sinker structures 13 and 33 in transistors 30 and 40 as discussed above. These sinker structures are preferably implanted with a masked p-type dopant to increase their conductivity. The resulting structure is illustrated in FIG. 3c.

Each of transistors 30 and 40 may now be completed in the conventional manner, resulting in the structures shown in FIG. 3d. According to this embodiment of the invention, these remaining steps may be performed simultaneously for transistors 30 and 40. In summary, epitaxial and polysilicon base regions (either silicon or silicon-germanium) are formed by epitaxial deposition, implantation as necessary, or are doped in-situ during epitaxial deposition. A buffer layer is formed by epitaxial deposition, and the base layer dimensions are defined by photolithographic patterning and etching the entire base stack. The emitter regions are then deposited and doped as appropriate, followed by an anneal to diffuse p-type dopant (in this example) into the buffer layer to form the emitter junctions. Transistors 30 and 40 are then completed by spacer formation, silicide formation, and the deposition of insulator layer 41 overall. Contacts are etched through insulator layer 41, and filled with contact plugs to provide connection to the collector, base, and emitter, respectively, of transistors 30 and 40. A first level of aluminum or copper metallization is then deposited and photolithographically patterned to define conductors that make contact to these terminals of transistors 30 and 40.

According to this embodiment of the invention, therefore, high voltage and high frequency bipolar transistors may be simultaneously formed in the same epitaxial layer structure. The distinction between high voltage and high frequency transistors is made by photolithographic patterns that define the location of heavily-doped buried collector regions and medium trenches in the epitaxial layers. The process is also highly compatible with the formation of MOS devices elsewhere in the integrated circuit, where BiCMOS technology is used.

Figure 4A:
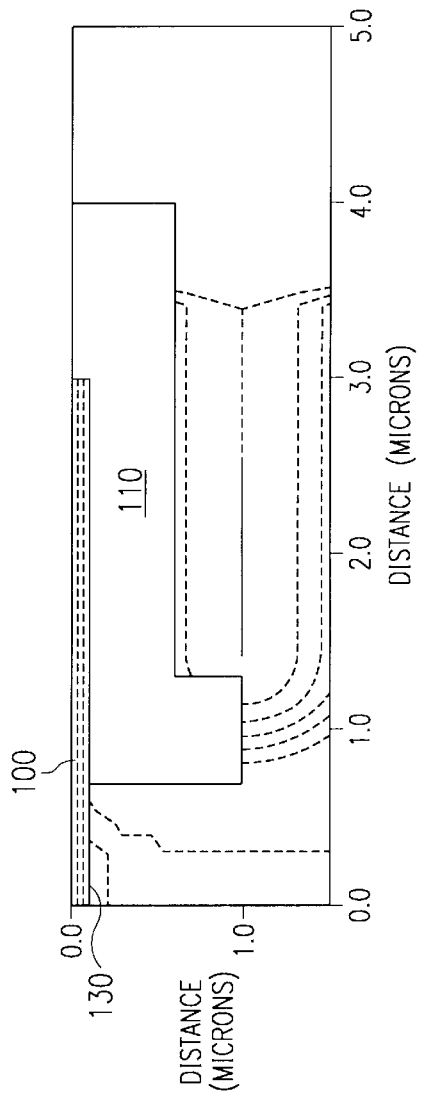
FIG. 4a is a cross-sectional view of an embodiment transistor with a medium trench extending from the shallow trench isolation structure into the collector region of the transistor.
Figure 4B:
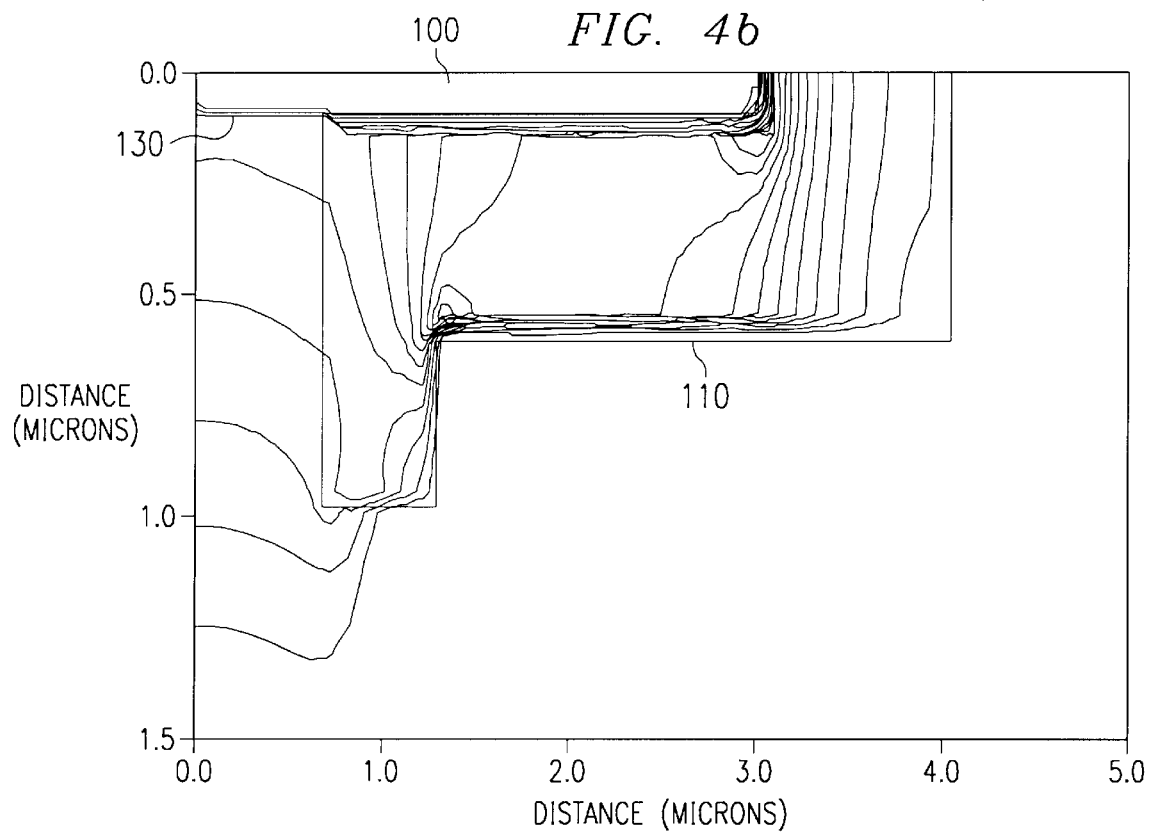
FIG. 4b is a plot of the transistor cross-section of FIG. 4a, but including a simulation of the potential gradient profile in the collector.
Figure 4C:
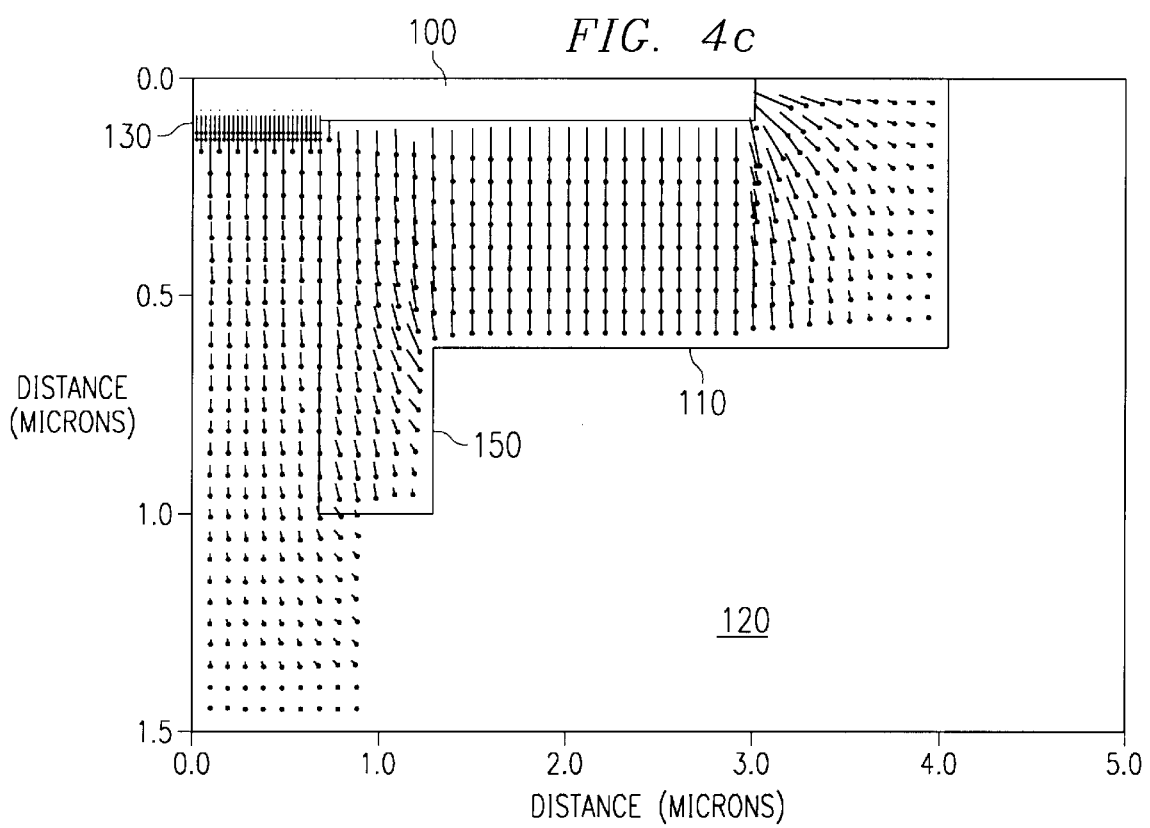
FIG. 4c is a plot of the transistor cross-section of FIG. 4a showing a simulation of the electric field where the field magnitude is to be inferred from the arrow length, and the field direction from the orientation of the arrow.

FIGS. 4a, 4b, and 4c are depictions of the cross-section of transistors that are symmetric about the center of base region 100. The scale of the transistor is shown in the figures. For example, base region 100 is approximately 0.05 $\mu$m to 0.2 $\mu$m thick and the half of the base region shown is approximately 3.0 $\mu$m in width. Base region 100 extends over shallow trench isolation structure 110. Base region 100 is also in contact with collector region 120 at base-collector interface 130 and with the emitter region (not shown). The emitter region is approximately 0.05 $\mu$m to 1 $\mu$m wide. The buried oxide layer is not shown, but the top edge of that layer would be coincident with the bottom edge of the figures. FIG. 4a is a depiction of the doping profile of an embodiment transistor. In FIG. 4b a simulation of the potential gradient profile in the transistor is superimposed on the diagram. In FIG. 4c, a simulation of the electric field distribution in the transistor is superimposed on the diagram and appears as arrows, the length of which indicate the field strength in a particular region of the transistor cross-section. The charge trajectory within the collector region 120 can be deduced from the direction of the field lines.

In traditional transistor structures, i.e. those lacking a medium trench as described herein, non-uniformities in the electric field distribution in the collector region forces a curved trajectory on the carriers, thus increasing the time of flight and reducing the operating frequency of the transistor. Moreover, the high field strength at the corners of the shallow trench isolation in such structures limits the breakdown voltage of the transistor. In contrast, the structure shown in FIG. 4c, which includes medium trench 150 extending into the collector region 120, exhibits low field strength at the corner of the trench 150. In addition, the structure features stronger drift fields in the core collector region 120 that lies beneath base collector interface 130, as well as an improved charge trajectory around the shallow trench isolation structure 110 into the lateral collector region.

The dimensions of the medium trench 150 can be selected in conjunction with the design of the buried collector contact region 31 (in FIG. 2, for example) for a particular combination of frequency, gain, and breakdown performance. By way of illustration and taking the device cross-sections of FIG. 4c as an example, the medium trench 150 produces improved breakdown performance when it extends approximately half of the distance between the bottom of the shallow trench isolation structure 110 and the top of the buried oxide (not shown) which is coincident with the bottom edge of FIG. 4c. In FIG. 4c, the base is approximately 0.05 $\mu$m to 0.2 $\mu$m thick and extends approximately 3.0 $\mu$m over the collector region 120 and shallow trench isolation structure 110 (recall that FIGS. 4a, 4b, and 4c depict only half of the cross section of the transistor). The base-collector interface is approximately 0.8 $\mu$m in length, while the shallow trench isolation structure is approximately 0.60 $\mu$m deep and extends approximately 3.25 $\mu$m. The collector region 120 is approximately 1.0 $\mu$m thick, measured from the base-collector interface 130 to the top of the buried oxide. The medium trench extends approximately 0.5 $\mu$m of the 0.8 $\mu$m distance between the bottom of shallow trench isolation structure 110 and the top of the buried oxide. The minimum width of the medium trench is governed by the physical limitations applicable to etching the trench and filling it with oxide or another insulator, but with current processes the width dimension that produces desirable results is in the range of 0.5 $\mu$m to 2.0 $\mu$m. The practical depth of the trench is dependent upon its width as a result of process limitations, but in this embodiment, the trench substantially improves breakdown performance when it leaves a gap of approximately 0.3 $\mu$m to 0.4 $\mu$m between the medium trench isolation structure 150 and the buried oxide layer.

As noted above, while the preferred embodiment of the invention is described in connection with p-n-p transistors, the same method and construction is equivalently applicable to the fabrication of n-p-n devices. It is further contemplated that complementary processes according to the preferred embodiment of the invention may be used in the same integrated circuit to fabricate complementary bipolar integrated circuits. By further extension, the resulting integrated circuit may include both complementary bipolar and complementary MOS devices. In addition, though the preferred embodiment of the invention is described in connection with a silicon-on-insulator structure, the concepts embodied herein are applicable to transistors fabricated directly onto a semiconductor substrate as is conventional in the industry. For conventional, i.e. non silicon-on-insulator structures, a space is left between the bottom of the medium trench and the bottom of the collector implant. The collector and buried layer implants are then patterned, as they are in the silicon-on-insulator process described herein.

Figure 5:
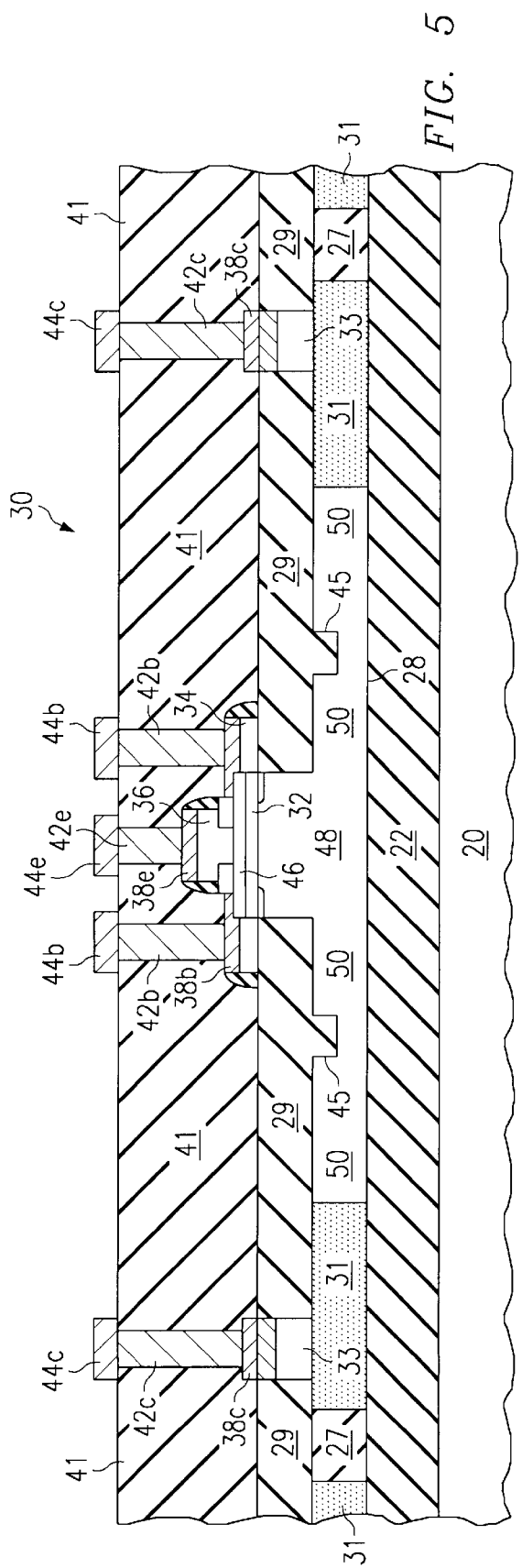
FIG. 5 is a cross-sectional diagram of a high voltage bipolar transistor according to a second preferred embodiment of the invention.

In a second preferred embodiment of the invention, the shape and location of the buried collector regions may be selected, in combination with the doping level in the remaining collector region, to set a desired breakdown voltage BVceo. In addition, the dimensions and locations of the medium trenches may be selected in combination with the characteristics of the buried collector region to increase breakdown voltage. As shown in FIG. 5, medium trench 45 may be pulled back from the edge of shallow trench 29 that is adjacent to the collector core 48, and the location of the buried layer 31 may be extended even further away from the medium trench to further increase the BVceo.

In a third preferred embodiment of the invention, the buried oxide layer (layer 22 in FIGS. 2 and 5) is removed. This approach is relatively low cost, but transistor performance may be adversely affected due to the junction isolation of the transistor collectors. In a fourth preferred embodiment of the invention, the deep trench (feature 27 in FIGS. 2 and 5) is eliminated along with the buried oxide layer 22. An advantage of this approach is lower cost, but at the risk of lower transistor performance.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. It is contemplated that such modifications and alternatives are within the scope of this invention as subsequently claimed herein.

We claim:

1. An integrated circuit, comprising a bipolar transistor, said bipolar transistor comprising:
    an emitter;
    a base; and
    a collector structure, wherein said emitter is adjacent to and overlies said base and said base is adjacent to and overlies a core portion of said collector structure;
    a buried insulator layer, wherein said collector structure is adjacent to and overlies said buried insulator layer;
    said collector structure comprising, in addition to said core portion, a collector contact region and a lateral collector region between said core portion and said collector contact region, wherein said lateral collector region is thinner than said collector contact region at some point along its length.

2. The integrated circuit of claim 1, wherein the thickness of said lateral collector region is determined by a trench formed in said collector structure.

3. The integrated circuit of claim 2, wherein said trench is formed adjacent said core portion of said collector structure.

4. The integrated circuit of claim 1, wherein said lateral collector region is approximately half the thickness of said collector contact region.

5. The integrated circuit of claim 1, wherein said core portion of said collector structure is thicker than said lateral collector region.

6. The integrated circuit of claim 1, further comprising a shallow trench isolation structure over said lateral collector region, said shallow trench isolation structure having a surface coplanar with said core portion of said collector structure.

7. An integrated circuit, comprising a bipolar transistor, said bipolar transistor comprising:
    a collector structure overlying a buried insulator layer, said collector structure comprising a first layer adjacent to said buried insulator layer that includes a central lightly doped region and a peripheral heavily doped region; said collector structure further comprising a second layer overlying said central lightly doped region of said first layer; said collector structure further characterized by a trench in said central lightly doped region at a point between said peripheral heavily doped region and a point where said second layer overlies said first layer;
    a base structure adjacent to and overlying said second layer in said collector structure; and
    an emitter structure adjacent to and overlying said base structure.

8. The integrated circuit of claim 7, further comprising:
    an isolation structure overlying portions of said first layer and coplanar with said second layer.

9. The integrated circuit of claim 7, wherein said trench is filled with an insulator.

10. The integrated circuit of claim 7, wherein said trench extends through said first layer of said collector structure approximately half way to said buried insulator layer.

11. An integrated circuit, comprising a bipolar transistor, said bipolar transistor comprising:
    an emitter;
    a base; and
    a collector structure, wherein said emitter is adjacent to and overlies said base and said base is adjacent to and overlies a core portion of said collector structure;
    said collector structure comprising, in addition to said core portion, a collector contact region and a lateral collector region between said core portion and said collector contact region, wherein said lateral collector region is non-uniform in thickness.

12. The integrated circuit of claim 11, wherein the non-uniformity in thickness of said lateral collector region comprises a trench formed in said lateral collector region.

13. The integrated circuit of claim 12, wherein said trench is formed adjacent said core portion of said collector structure.

14. The integrated circuit of claim 11, wherein said lateral collector region is approximately half the thickness of said collector contact region at said non-uniformity in thickness.

15. The integrated circuit of claim 11, further comprising a buried insulator layer, wherein said collector structure is adjacent to and overlies said buried insulator layer.

16. The integrated circuit of claim 11, wherein said core portion of said collector structure is thicker than said lateral collector region.

17. The integrated circuit of claim 11, further comprising a shallow trench isolation structure over said lateral collector region, said shallow trench isolation structure having a surface coplanar with said core portion of said collector structure.

* * * * *